United States Patent
Eggert

(10) Patent No.: US 11,486,990 B2
(45) Date of Patent: *Nov. 1, 2022

(54) METHOD FOR RADIO MEASURING APPLICATIONS

(71) Applicant: METIRIONIC GMBH, Dresden (DE)

(72) Inventor: Dietmar Eggert, Dresden (DE)

(73) Assignee: Metirionic GmbH, Dresden (DE)

( * ) Notice: Subject to any disclaimer, the term of this patent is extended or adjusted under 35 U.S.C. 154(b) by 281 days.

This patent is subject to a terminal disclaimer.

(21) Appl. No.: 16/820,228

(22) Filed: Mar. 16, 2020

(65) Prior Publication Data

US 2020/0252814 A1 Aug. 6, 2020

Related U.S. Application Data

(63) Continuation of application No. PCT/EP2018/000436, filed on Sep. 17, 2018.

(Continued)

(30) Foreign Application Priority Data

Sep. 15, 2017 (DE) ...................... 10 2017 008 647.8

(51) Int. Cl.
  *G01R 29/08* (2006.01)
  *G01S 13/76* (2006.01)
  (Continued)

(52) U.S. Cl.
  CPC .......... *G01S 11/02* (2013.01); *G01R 29/0871* (2013.01); *G01R 29/0892* (2013.01);
  (Continued)

(58) Field of Classification Search
  CPC ............ G01S 13/87; G01S 5/02; G01S 13/84; H04W 16/28; H04W 72/082; H04W 64/003; H04B 17/00

See application file for complete search history.

(56) References Cited

U.S. PATENT DOCUMENTS

| 3,243,812 A | 3/1966 | Williams |
| 7,061,369 B2 | 6/2006 | Bergerhoff |

(Continued)

FOREIGN PATENT DOCUMENTS

| DE | 10 2009 060 505 A1 | 7/2010 |
| DE | 10 2009 060 591 A1 | 7/2010 |

(Continued)

OTHER PUBLICATIONS

Rick Roberts, "TDOA Localization Techniques," IEEE 802.15-04a/572r10, Presentation, pp. 1-11 (Oct. 4, 2004).

*Primary Examiner* — Iqbal Zaidi

(74) *Attorney, Agent, or Firm* — Muncy, Geissler, Olds & Lowe, P.C.

(57) ABSTRACT

A method for radio measuring applications, wherein at least a first radio node operates as an initiator and at least a second radio node as a transponder, in a first step a first carrier frequency is transmitted by the initiator as an initial signal and received by the transponder. In a second step a response signal with a second carrier frequency is transmitted by the transponder and received by the initiator, during a measurement cycle at least one step sequence of the first and the second step is performed. First the first steps of all sequence of steps and subsequently at least a portion of the second steps of the step sequences are performed in succession, the first carrier frequency assumes a value within a predetermined frequency domain for each repetition, and the initial signals and the response signals are mutually coherent at least within the measurement cycle.

12 Claims, 4 Drawing Sheets

Related U.S. Application Data

(60) Provisional application No. 62/559,116, filed on Sep. 15, 2017.

(51) Int. Cl.
*H04W 24/08* (2009.01)
*G01S 13/46* (2006.01)
*G01S 11/02* (2010.01)
*H04B 17/27* (2015.01)
*H04B 17/30* (2015.01)

(52) U.S. Cl.
CPC .......... *G01S 13/765* (2013.01); *G01S 13/767* (2013.01); *H04B 17/27* (2015.01); *H04B 17/30* (2015.01); *H04W 24/08* (2013.01); *G01S 2013/462* (2013.01)

(56) References Cited

U.S. PATENT DOCUMENTS

| | | | |
|---|---|---|---|
| 8,405,543 B2 | 3/2013 | Kluge et al. | |
| 8,406,144 B2 | 3/2013 | Sachse et al. | |
| 8,644,768 B2 | 2/2014 | Kluge et al. | |
| 10,466,350 B2 | 11/2019 | Kluge et al. | |
| 2009/0149198 A1 | 6/2009 | Nam et al. | |
| 2010/0074133 A1 | 3/2010 | Kim et al. | |
| 2011/0006942 A1* | 1/2011 | Kluge | G01S 11/02 342/125 |
| 2015/0111591 A1* | 4/2015 | Hoffberg | G06Q 20/40 455/452.1 |
| 2019/0342709 A1* | 11/2019 | Markhovsky | G01S 13/24 |

FOREIGN PATENT DOCUMENTS

| | | |
|---|---|---|
| DE | 10 2009 060 593 A1 | 7/2010 |
| DE | 10 2009 060 592 B4 | 6/2012 |
| EP | 2 244 098 A1 | 10/2010 |
| EP | 3 067 712 A1 | 9/2016 |
| WO | WO 02/01247 A1 | 1/2002 |
| WO | WO 2005/119379 A1 | 12/2005 |

* cited by examiner

METHOD FOR RADIO MEASURING APPLICATIONS

This nonprovisional application is a continuation of International Application No. PCT/EP2018/000436, which was filed on Sep. 17, 2018, and which claims priority to German Patent Application No. 10 2017 008 647.8, which was filed in Germany on Sep. 15, 2017, and to U.S. Provisional Application No. 62/559,116, which was filed on Sep. 15, 2017 and which are all herein incorporated by reference.

BACKGROUND OF THE INVENTION

Field of the Invention

The present invention relates to a method for radio measuring applications, having at least two radio nodes for determining a transfer function and/or a time offset between the radio nodes.

Description of the Background Art

There are a variety of methods for determining the distance based on the measurement of phases and phase differences of reference signals in the frequency domain. The basic principle has been known for more than 50 years, for example from U.S. Pat. No. 3,243,812. The method has been used in various applications for decades. In addition to a large number of publications, there are also a number of patents.

DE 10 2009 060 505 B4 describes a method for communication between two radio nodes, wherein the radio nodes mutually transmit and receive signals and the carrier frequencies of the signals are changed for each repetition. The phase values extracted from the second radio node are subsequently transmitted back to the first radio node and then evaluated together with the received signals of the first radio node to determine a distance between the two radio nodes.

DE 10 2009 060 593 A1 discloses a further method for measuring the distance between two radio nodes, wherein the radio nodes exchange unmodulated carrier signals, each radio node identifies two phase values for two frequencies, and the distance between the radio nodes is determined from the total of four phase values.

Alternative methods for distance measurement between two radio nodes are known from DE 10 2009 060 592 B4 and DE 10 2009 060 591 A1.

SUMMARY OF THE INVENTION

It is therefore an object of the present invention to provide a device which further develops the prior art.

According to an exemplary embodiment of the invention, a method for radio measuring applications is provided, wherein at least two radio nodes are provided.

At least a first radio node operates as an initiator and at least a second radio node operates as a transponder.

Each radio node comprises a timer and a data interface, wherein there is a time offset between the timers of the radio nodes.

In a first step, a first carrier frequency is transmitted by the initiator as an initial signal and the initial signal is received by the transponder during a first reception period.

In a second step, a response signal with a second carrier frequency is transmitted by the transponder and the response signal is received by the initiator during a second reception period.

The first step and the second step form a step sequence. During a measurement cycle, at least one step sequence is performed, wherein first, the first steps of all step sequences and subsequently, the second steps of at least a portion of the step sequences are performed.

For each repetition of the step sequence, the first carrier frequency of the initial signal assumes a predetermined value within a predetermined frequency domain.

The initial signals and the response signals of all step sequences are coherent to one another at least during the measurement cycle.

The method comprises a first mode and a second mode.

In the first mode, the response signal is formed at least from a portion of the received initial signal, and a transfer function and/or the time offset are determined based on at least one portion of the received response signals.

In the second mode, the response signal is formed independently from the received initial signal, at least one received initial signal is transmitted by means of the data interface and at least one transfer function and/or the time offsets are determined based on at least a portion of the received response signals and at least a portion of the received and transmitted initial signals.

It is understood that each radio node can comprise a receiving unit, a transmitting unit, a signal processor, a data interface and at least one antenna.

If a radio node comprises several antennas, the initial signal and/or the response signal is transmitted by one of the antennas or the initial signal and/or the response signal is emitted by several antennas. For example, the antennas radiate sequentially in succession during a transmission period. To this end, the transmission period is, e.g., divided into several time windows, wherein in each case one of the antennas transmits during a time window. It is understood that the reception of the signals can also be organized accordingly.

All of the values or signal vectors transmitted with the inventive method can be manipulated by suitable encryption mechanisms to protect the running processes accordingly. For example, each signal vector can be assigned a time-varying number sequence that is known a priori to only the initiator and the transponder.

In accordance with alternative exemplary embodiments, the data interface is configured wired or wirelessly and enables the exchange of data, e.g., of determined signal vectors as well as the rough synchronization of the radio nodes.

An initiator is a radio node that transmits a signal in a first step.

A transponder is a radio node which receives and processes the signal transmitted in a first step. Only in a second step does the transponder transmit back a response signal.

By means of the method, a time offset between the individual timers and/or a transfer function can be determined. A prerequisite is that there is coherence between the signals of the first step and the signals of the second step.

The transfer function represents the transmission properties between two radio nodes in the frequency domain, i.e., the transmission of a signal via a propagation medium, and is the term used in the field of wireless data transmission. In many cases, the transfer function is also called the system function.

The recorded values can be transformed from the frequency domain to the time domain by means of a Fourier transform. In the time domain, the term channel impulse response is also generally used for the transmission behavior of a propagation medium.

The method comprises a first and a second mode, wherein each mode is closed for itself. What is decisive for mode 1 is that within the signal exchange, additional information is transmitted within the measurement signal, whereas mode 2 only uses the data interface for the transmission of this information. One system operates in each case in one of the modes within a period of time. Switching between the modes is possible.

By means of the method, it is possible to specify a transfer function for the propagation behavior of a propagation medium from the initiator to the transponder or from the transponder and to the initiator (also referred to as 1 WR one-way transfer function), or for one cycle, that is, one transfer from the initiator to the transponder and from the transponder back to the initiator (also known as a 2 WR two-way transfer function).

From the determined transfer function in the frequency domain, in turn, the distance between the involved radio nodes can be ascertained.

The phase response between the signals is particularly important. If the propagation behavior within a medium is dominated by the direct path, then the group delay $t_g$ of the electromagnetic wave can be calculated from the phase response from a derivation.

$$t_g = \frac{d\varphi}{d\omega}$$

The speed of propagation c of the electromagnetic wave creates a direct relationship to the distance d between the radio nodes corresponding to $d=c*t_g$.

A characteristic of all measurement methods is the mutual transmission of a reference signal, i.e., of the initial signal or the response signal, which is received by the other node, wherein the position of the received signal in the complex plane is evaluated with regard to its internal time reference.

A sequence of steps of the first step and the second step represents a core operation, which is also referred to as an atomic operation or ping-pong.

The phase coherence must be preserved at a minimum for one step sequence.

The transmission channel in many cases is characterized in several ways, wherein in addition to the direct connection between two radio nodes, other paths can also be created by reflection on objects and/or by refraction and/or by diffraction.

In order to resolve multiple paths in the received signals, the sequence of steps, i.e., the mutual transmission and reception of reference signals, is repeated several times in frequency steps over a bandwidth (predetermined frequency domain). In this way, the transfer function can be determined on the basis of a set of interpolation points in the frequency domain.

The bandwidth of the predetermined frequency domain is decisive for the ability of the method to resolve signal paths having different lengths. Since it is a discrete-frequency representation, the frequency interval determines the range over which a distance can be unambiguously determined, while at the same time limiting the size of the unambiguously determinable time offsets.

The measurement cycle includes at least one step sequence and usually a plurality of step sequences. In this case, a measurement cycle can comprise a larger number of first steps than second steps. The duration of the measurement cycle is dependent on the number, type and duration of the individual step sequences and the frequencies used.

The change of the first carrier frequency can take place in different ways.

For example, a frequency sweep is carried out, wherein the first carrier frequency is increased or reduced by a constant value within the predetermined frequency domain with each repetition during the measurement cycle. A sweep can be implemented with little implementation effort. As a rule, it is easier to maintain phase relationships over a number of smaller frequency steps. However, due to legal provisions, this embodiment is limited for many applications in respect of the permitted transmission power.

A more irregular change in the frequency is also known as frequency hopping. The different frequencies or values for the carrier frequency for each individual repetition are stored, for example, in a lookup table or are based on a predetermined mathematical function. For example, the frequency hopping can be carried out based on pseudo noise sequences, as a result of which a high robustness against interference sources is achieved. At the same time, this embodiment of the method allows for using higher transmission powers in compliance with a wide variety of legal provisions and regulatory requirements. It is thus possible to expand the use of the method to a greater reach.

Maintenance of the phase coherence of the signals over a limited period of time (all first steps and at least a portion of the second steps) and between radio nodes is an important property of the method and a prerequisite for the reconstruction of the signal profile.

The coherence requirement can be extended to a plurality of measurement cycles.

In addition to the distance, an extraction of further parameters, for example, an angle of incidence between radio nodes (two or more) for relative position determination is also possible. For this purpose, the received signals of several antennas must be evaluated, or the transmitted signals must be definedly distributed to several antennas. This can be done in parallel/simultaneously by using several transmitting and receiving units. Alternatively, the antennas can also be assigned chronologically successively in different time windows within the sequence of steps and by switching the antennas between the time windows. During switching, corresponding settling times must be taken into account.

Since the behavior of the environment is also represented through various propagation paths in the transfer function, in a development, the method also allows for a characterization of the electromagnetic behavior in the environment and can therefore be extended to so-called passive radar systems such as locating space or determining the positions and movements of objects.

It should be noted that if further radio sources are available, the electromagnetic radiation can also be reflected in the measurement results and is used for analysis. In this way, it is possible to derive complex positional states which can be used, inter alia, to authenticate objects.

The predetermined frequency domain preferably corresponds, for example, to the available frequency domain, i.e., it depends on the bandwidths provided by the radio nodes available. Alternatively, the technically possible frequency domain is restricted on the basis of legal requirements and/or due to a specific application, so that the predetermined frequency domain only comprises a partial range of the available frequency domain. It is understood that when transmitting signals through the air, the carrier frequencies must be suitable for coupling out into air.

Each radio node follows a fixed temporal sequence which is permanently bound to the timer and the corresponding cycle controller and is therefore deterministic. This means that all function blocks have a fixed time and phase reference over the required periods and fulfill the respective requirements for phase coherence. Because the time response of the radio nodes among the nodes is known a priori (with the exception of initial phase position, time offset and frequency offset), a coherence relationship is produced between the radio nodes.

However, for the execution of the method it is important that the corresponding transmission and reception periods (possibly also transmission and reception time windows) are also opposite each other, and that corresponding settling times are completed, i.e., a stationary state has been established.

The tolerable fluctuation of the time offset, which is protected by rough synchronization, is based on the size of the measurement range and should be less than 1 µs for a measurement range of 300 m, for example, in order to avoid increased amounts of time and frequency offset correction. The achievable measurement accuracy in the 2.4 GHz range is below 1 m.

With respect to this characteristic, this method differs significantly from established UWB TDOA (time difference of arrival) techniques. Since here the measurement accuracy is determined by the synchronization, the synchronization quality needs to be better than 3 ns with a comparable accuracy.

As noted, each radio node has its own time reference. The time reference is preferably designed as a crystal oscillator (XTAL/XOSC). It is understood that the rough time alignment does not replace the determination of the actual time offset in a core operation, but rather is a prerequisite.

An advantage is that the flexibility of the process and reliability are increased. Another advantage is that the method can be carried out more quickly and cost-effectively.

The determination of the time offset, or the time offset of two radio nodes involved in the communication is important for further processing of the measurement results.

The time offset can also be used to synchronize units of a system and therefore is of great importance.

Any other type of data exchange is referred to as a data interface, for example, a communication protocol for a wireless exchange, for example Bluetooth, Zigbee or IEEE 802.11, which allows for an exchange of data frames for rough synchronization even without further cost in terms of equipment. Alternatively, the data interface can be designed as a data line or connection for a data line.

If, according to the first mode, the response signal is formed at least from a portion of the received initial signal, information about the received initial signal is accordingly transmitted directly back to the initiator. The received response signal thus contains information about the outward and return path between the radio nodes. This makes it possible for the 2 WR transfer function to be determined solely on the basis of the response signals received.

If, according to the second mode, the response signal is formed independently from the initial signal, then according to a first alternative embodiment, at least one received signal vector determined by the transponder is transmitted to the initiator via the data interface. In this way, further evaluation can be carried out by the initiator or by a computing unit communicating with the initiator. The 2 WR transfer function can be determined on the basis of the received response signals and the received and transmitted initial signals.

If the time offset is determined on the basis of at least one initial signal and at least one response signal, then it is possible to determine the 1 WR transfer function. The latter is possible both in the first mode as well as in the second mode.

An advantage of the method according to the invention is therefore that no further data transmission of all, or at least many, of the measurement results of the transponder is necessary. As a result, both the technical outlay and the amount of time can be reduced.

The first steps of the sequence of steps can be performed during the measurement cycle in accordance with a first sequence and the second steps of the sequence of steps are performed in accordance with the first sequence or in a sequence reverse to the first sequence. If the frequency is increased, for example, with each further sequence of steps, the result is a frequency response that increases over the first steps. If the second steps are performed in the same sequence, the frequency response returns to baseline value and again increases over the second steps. If the second steps, however, are performed in reverse sequence, the frequency response decreases starting from the value of the last first step over the second steps.

The second carrier frequency within each step sequence can correspond to the first carrier frequency. Alternatively, the second carrier frequency within a step sequence differs from the first carrier frequency.

It is understood that the temporal course of the carrier frequencies or the frequency changes may be known in advance to the radio nodes involved. For example, the second carrier frequency is always changed in accordance with the first carrier frequency. Alternatively, the change of the second carrier frequency is made independently from the change in the first carrier frequency or not at all. The change, i.e., the frequency step carried out during a repetition, is the same for each repetition or changes with each repetition, for example according to a predetermined list or mathematical function known to all radio nodes that also includes the temporal behavior and thus preserves the required phase coherence.

The second steps of all step sequences can be performed during the measurement cycle. A measurement cycle thus includes the same number of first and second steps.

A first complex signal vector (receive signal vector) can be determined from the received initial signal, wherein the response signal is formed from the first complex signal vector or alternatively from the reciprocal first complex signal vector.

For the first alternative, the response signal received by the initiator corresponds to a frequency-by-frequency multiplication of the complex signal vector with the channel transfer function of the propagation medium. As a result, the square of the channel transfer function sampled discretely in the frequency domain is produced. In the time domain, this result corresponds to the discrete-time sampled convolution of the channel impulse response with itself.

For the second alternative, the response signal received by the initiator provides a delay operator $e^{j\omega*2*T_{off}}$, which allows for the determination of the time offset between the two radio nodes. The 1 WR channel transfer function can be determined using this value. Furthermore, this value can also be used as a manipulated variable within precision synchronizations and also for testing a temporal synchronization of function blocks.

A first complex signal vector can be determined, and the response signal is formed from the conjugate complex first complex signal vector.

The received response signal formed of the square of the first complex signal vector and a delay operation, which is indicated by the time offset between the nodes.

A first phase can be determined from the received initial signal, wherein the response signal is formed either from the first phase or from the inverted first phase. These alternatives are particularly quick and easy.

At least one radio node can always operate as an initiator and always at least one radio node as a transponder, wherein each radio node operates at least once as the initiator over a plurality of step sequences and at least once as the transponder, or each radio node operates only as the initiator or only as the transponder over a plurality of step sequences.

If it has been determined, which function a radio node is to perform, it is possible to adapt the functionalities of the individual radio nodes to the function and to thus simplify the radio nodes and design them in a more cost-effective manner.

A distance between the at least one initiator and the at least one transponder can be determined based on the determined transfer function and/or the time offset. From the results obtained, it is possible to determine the position of one of the radio nodes.

A multipath analysis can be carried out for at least one determined channel transfer function. The multipath analysis focuses on evaluating the indirect propagation paths. This way, the most diverse forms of passive radar systems are possible. Depending on their complexity, these range from simple motion detection (e.g., room surveillance) to image creation on the basis of the radio waves.

A filter can be applied to the received response signals and/or the received initial signals, prior to the determination of the transfer function and/or the time offset. As a filter, for example, a $\cos^2$ window can be used to suppress secondary maxima. Higher measurement dynamics or noise reduction can, for example, take place by averaging the measured values within a sequence of steps.

In addition to the carrier frequency of the initial signal, an amplitude and/or a phase of the initial signal are changed with each repetition.

The initiator can transmit the initial signal during a first transmission period and the transponder transmits the response signal during a second transmission period, wherein the first transmission period and the second transmission period each comprise a plurality of successive time windows, in each case transmissions are made only during the time window and in each case two successive time windows follow one another immediately in time or are offset from one another in time.

The reception periods can also comprise a plurality of time windows, wherein the time windows of the transmission periods and the time windows of the reception periods can, but do not have to, correlate with one another (apart from the time offset).

This approach allows in particular for adapting to different application adaptations, such as separate transmission of the reference phase, signaling between initiator and transponder (amplification and transmission power adjustments, encryption), noise reduction by averaging, assignment to different antennas to produce space diversity for determining angles of incidence in particular and for improving measurement accuracy in general (beam steering, MIMO, Smart Antennas), or also for the detection of channel assignments in the sense of LBT (Listen-before-Talk), CS (Carrier Sense) and DAA (Detect and Avoid) requirements for the approval of radio systems.

Further scope of applicability of the present invention will become apparent from the detailed description given hereinafter. However, it should be understood that the detailed description and specific examples, while indicating preferred embodiments of the invention, are given by way of illustration only, since various changes, combinations, and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings which are given by way of illustration only, and thus, are not limitive of the present invention, and wherein.

DETAILED DESCRIPTION

Figure 1:
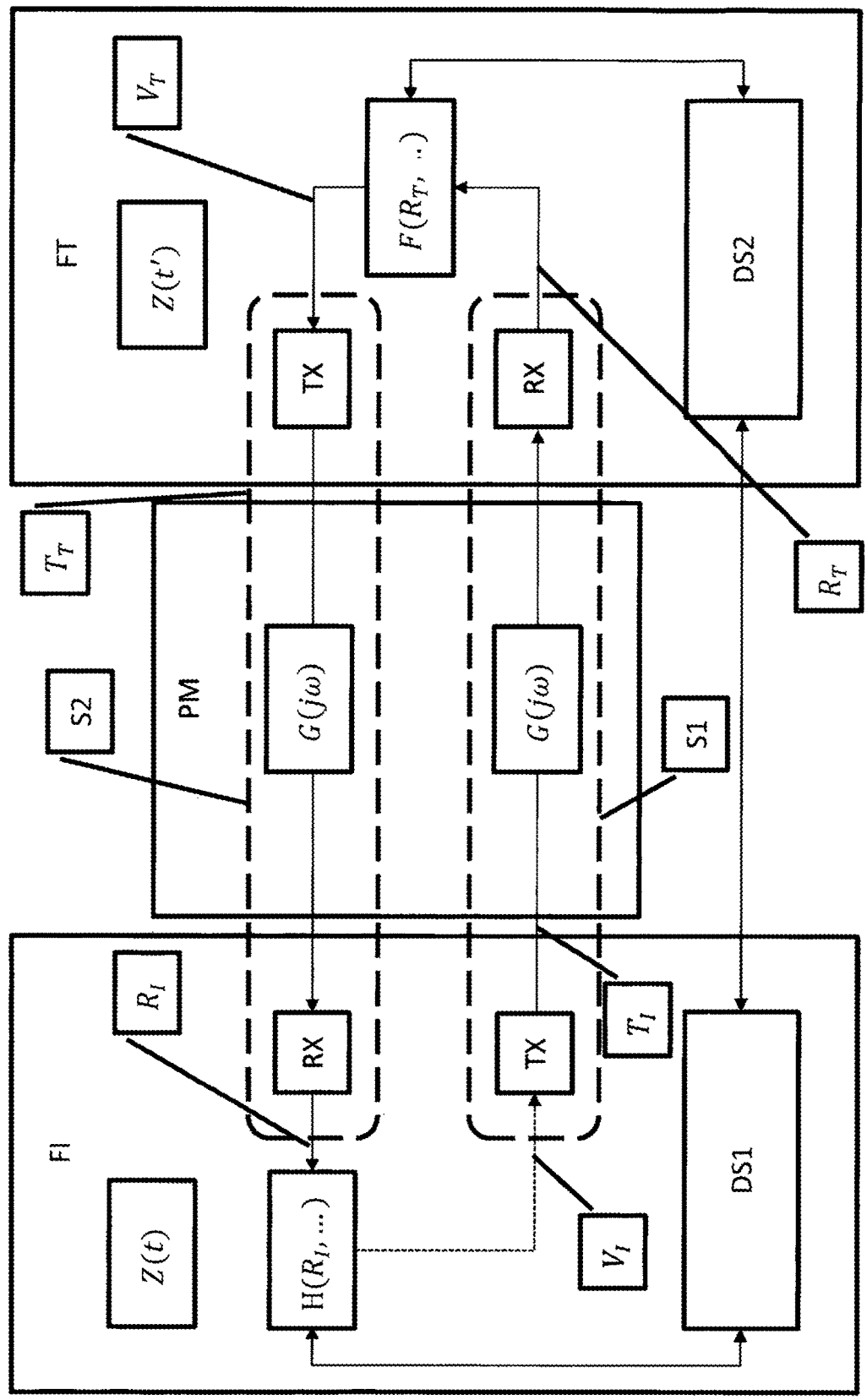
FIG. 1 is a schematic measurement arrangement for performing an inventive method for radio measuring applications in accordance with an exemplary embodiment.

The illustration in FIG. 1 shows a diagram of an arrangement of two radio nodes for radio measuring applications, wherein the arrangement is designed to run a first mode of the inventive method.

A first radio node FI, called the initiator, and a second radio node FT, called the transponder, are provided. The initiator FI and the transponder FT each have a receiving unit RX, a transmitting unit TX, a data interface DS1 or DS2 and their own timer $Z(t)$ or $Z(t')$.

The data interfaces DS1 and DS2 are designed as a communication protocol for wireless data exchange. There is a time offset $T_{offs}$ between the first timer $Z(t)$ of the first radio node FI and the second timer $Z(t')$ of the second radio node. The timers are each formed as crystal oscillators.

The initiator FI is designed to transmit an initial signal $T_I$ during a first step S1 by means of the transmitting unit TX over a propagation medium PM, for example air. The transponder FT is designed to receive the initial signal $T_I$ transmitted by the initiator $F_I$ during the first step S1 as a received initial signal $R_T$ after transmission over the propagation medium PM.

In addition, the transponder FT is designed to determine a signal vector $V_T$ from the received initial signal $R_T$ using a function $F(R_T, \ldots)$ and to exchange it by means of the data interface DS2.

In order to be able to execute the first mode of the method according to the invention, the transponder FT is additionally designed to provide the signal vector $V_T$ to the transmitting unit TX and to process it further by means of the transmitting unit TX.

During a second step S2, the transponder FT transmits a response signal $T_T$ by means of the transmitting unit TX. During the second step S2, by means of the receiving unit RX, the initiator FI receives the response signal $T_T$ emitted by the transponder after transmission over the propagation medium PM as the received response signal $R_I$.

Moreover, the initiator FI is designed to determine the signal vector $V_I$ from the received signal $R_I$ using the function $H(R_I, \ldots)$ and to exchange it with the data interface DS1.

The influence of the transmission over the propagation medium PM on the transmitted signals is referred to as transfer function G.

A method sequence according to the first alternative embodiment of the method for radio measuring applications is explained in more detail below with reference to FIGS. 2 and 3.

Figure 2:
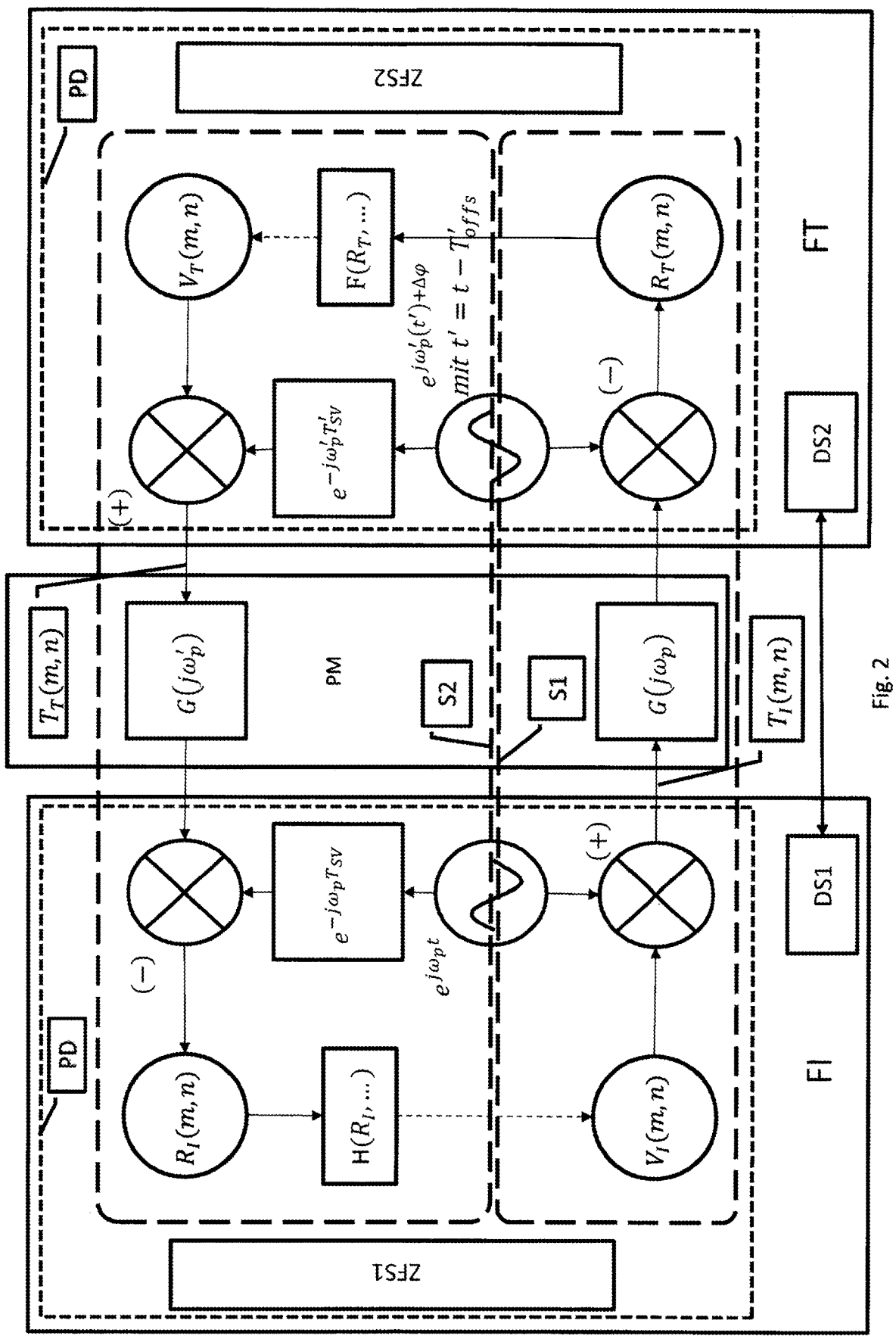
FIG. 2 is a flow chart of the exemplary embodiment of the method for radio measuring applications.

As shown in FIG. 2, both radio nodes FI and FT each have a generator, an upward mixer which converts a complex signal vector VT or VI from the baseband to the HF position, a downward mixer which converts a high-frequency signal to a signal vector in the baseband, and a time and frequency control ZFS1 or ZFS2 containing the timer Z (t) or Z (t'), which controls all system changes of state in a fixed time regime.

The time and frequency control ZFS1 or ZFS2 works on the basis of a time unit $T_{MU}$ and ensures that all relevant changes of state (sampling of the signal vectors, RX/TX-TX/RX transitions, frequency changes) are firmly connected with the time base specified by the respective timer and can be related to this.

The time and frequency control ZFS1 or ZFS2 is also responsible for ensuring that the coherence between the signals and vectors is maintained over the required length, i.e., that settling times are taken into account and all the functional units, even in the transition regions, are located in the linear control ranges (such as a frequency synthesizer, PLL). The radio nodes FI and FT are controlled by the time and frequency control ZFS1 and ZFS2 during the step sequence of steps S1 and S2.

The step sequence also includes the transition regions (step delay), which are shown as delay elements of the value $T_{SVS}$. The time and frequency control ZFS1 or ZFS2 also controls the frequency $\omega_p$ over an available frequency domain.

As a result, the time and frequency control ZFS1 and ZFS2 each generate a phase-coherent domain PD, in which the high-frequency synthesis, the generation of the corresponding transmit vectors and the extraction of the receive vectors are in a fixed relationship to one another on the live end.

Furthermore, each radio node has a logic unit which supplies the signal vectors $V_T$ or $V_I$ for generating the corresponding transmission signal $T_I$ (m, n) or $T_T$ (m, n) by using a function F or H based on input parameters (such as the received signal vectors $R_I$ (m, n) and $R_T$ (m, n) and/or the parameters provided via the data interface DS1 or DS2).

In the drawings, n indicates the index within a sequences of steps, which overall has a duration of $T_{SF} = n_{max} * T_{MU}$. The index has a range of values n=0,1, ... ($n_{max}-1$), wherein $n_{max}$ is determined by the specific design of the measurement cycle and in the present example, $n_{max}=8$ was selected. In connection with the measurement unit time $T_{MU}$, n provides the basis for a discrete-time system on the basis of $t=n*T_{MU}+m*T_{SF}$. Here, m indicates the index of the sequence of steps within the measurement cycle with m=1, 2 ... ($m_{max}$). $m_{max}$ is determined by the specific embodiment and is, inter alia, dependent on the number of frequencies for which the transfer function is to be determined. A series of step sequences is referred to as the measurement cycle. A measurement cycle has a length of at least $T_Z = m_{max} * T_{SF}$. To differentiate between initiator radio node FI and transponder radio node FT, the corresponding values of the transponder are indicated by markings (for example, frequencies and times of the $f'_p$, $\omega'_p$, t', ...).

Figure 3:
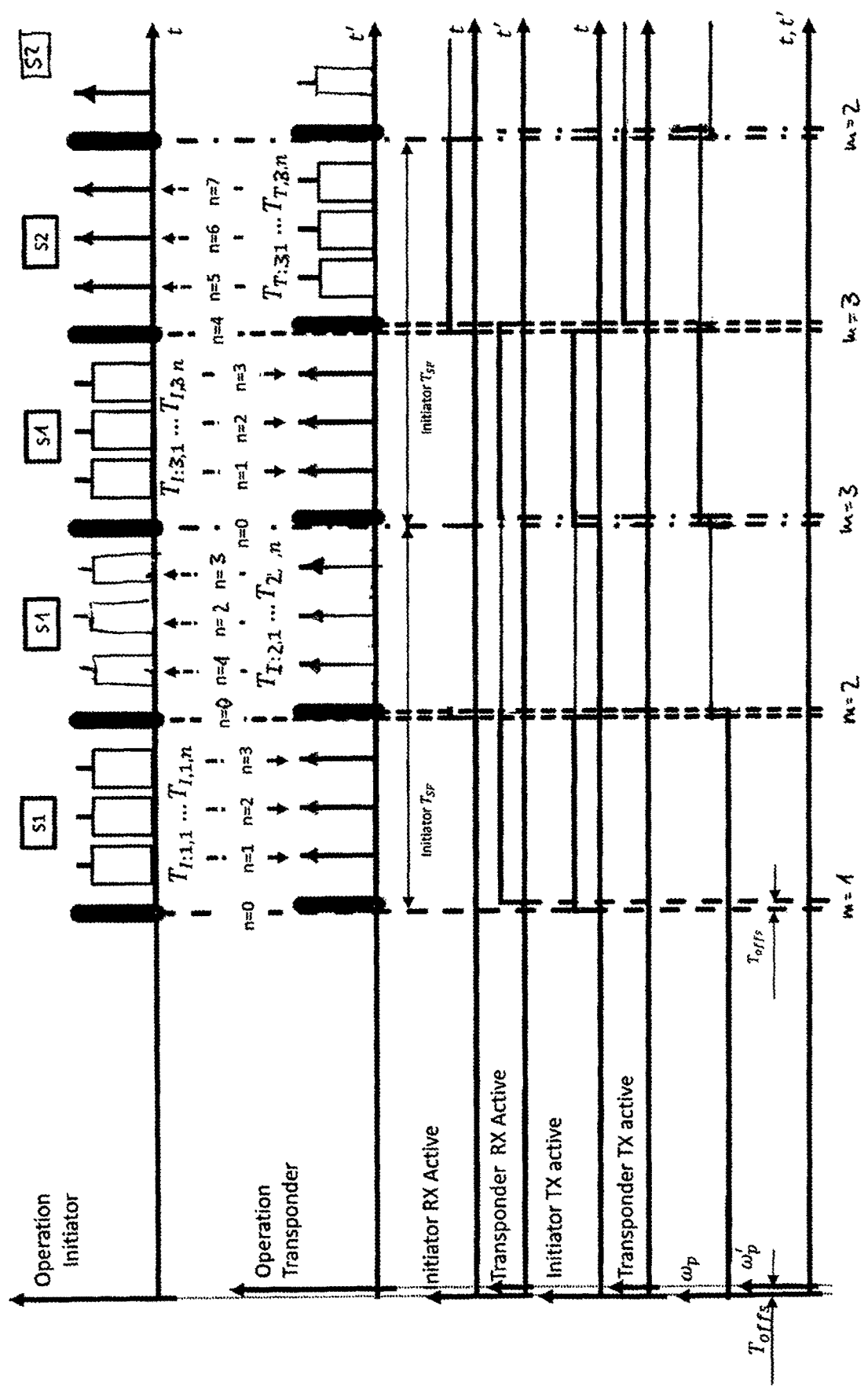
FIG. 3 is a diagram of the temporal course of the method for radio measuring applications according to exemplary embodiment.

As illustrated in FIGS. 2 and 3, in the initiator FI and in the transponder FT, the frequency generator first generates a signal of the frequency $f_p$, $f_p'$ or $\omega_p = 2\pi * f_p$, $\omega'_p = 2\pi * f'_p$ with (p=1), wherein the signal of the frequency generator of the transponder is delayed by the time offset $T_{offs}$ and has a static phase offset $\Delta\varphi$. For the purposes of the further explanation, these frequencies are considered equally great. It is assumed that corresponding frequency offset corrections (if necessary) have already been carried out or that the necessary parameters have already been extracted to correct the receive vectors accordingly. Thus, for the other statements, $f_p = f_p'$ is assumed, wherein the method also includes frequency differences $f_p = f_p' + \Delta f$, if $\Delta f$ is known, for example, has been provided by the receiving architecture.

The method comprises a plurality of step sequences from a first step S1 and a second step S2, wherein with each repetition of the step sequence, the carrier frequencies $\omega_p$ and $\omega'_p$ are selected within a predetermined frequency domain according to the corresponding requirements. In the exemplary embodiment shown, the second carrier frequency $\omega'_p$ corresponds to the first carrier frequency $\omega_p$.

The multiple repetitions of the sequence of steps form a measurement cycle. According to the invention, in each measurement cycle first all the first steps S1 are performed successively, then the second steps S2 of the step sequences of the measurement cycle are performed.

In a first step S1 m=1, n=0,1,2,3 p=1 of a first step sequence, the initiator FI uses a mixer and the frequency generator to generate a signal $T_I$ (m, n) with a first carrier frequency $\omega_p$ with a signal vector $V_I$ (m, n) and couples it out into the propagation medium PM as initial signal $T_I$ (m, n). To illustrate, the signal vector is $T_I$ (m, n)=1, i.e., the initiator radio node transmits a reference signal with a carrier frequency $\omega_p$ as the initial signal $T_I$.

It is understood that the above-described does not exclude the signal vectors $V_I$ or $V_T$ from being brought to an intermediate frequency IF before coupling out in a further mixer by multiplication with a subcarrier, often referred to as a local oscillator, before the signal is finally converted to the actual target frequency $\omega p$.

During a first reception period in the step S1 with m=0, n=0,1,2, 3, the transponder FT determines a received initial signal $R_T$ (m, n) by mixing the received HF signal with the signal of the frequency generator of the frequency $f'_p$, which is shifted/offset in time by Toffs with respect to the generator signal of the initiator.

The position of the received initial signal $R_T$ (m, n) in the complex plane is determined by the internal time reference or by the second timer Z(t') with $t' = n*T'_{MU} + m*T'_{SF}$ of the transponder FT and with respect to the initiator is determined by the transfer function of the radio channel on the frequency $f_p$ and the time offset and phase offset $T_{offs}$ or $\Delta\varphi$ between the timers. In the context of the method, $T_{MU} = T'_{MU}$, $T_{SF} = T'_{SF}$, $T_Z = T'_Z$, and so on. Based on the received initial signal $R_T$ (m, n), a signal vector $V_T$ (m, n+4)=F ($R_T$ (m, n), ...) is formed and transmitted as signal vector $V_T$ to the transmitting unit TX of the transponder FT.

The transponder also forms a discrete-time system with $t' = n*T'_{MU} + m*T'_{ASF}$.

In a further first step S1 m=2, n=0,1,2,3 p=2 of a second step sequence, the initiator FI uses a mixer and the frequency generator to generate a signal $T_I$ (m, n) with a first carrier frequency $w_p$ (p=2) with a signal vector $V_I$ (m, n) and couples it out into the propagation medium PM as initial signal $T_I(m, n)$, and in a further step S1 with m=2, n=0,1,2,3 p=2, during a reception period the transponder determines a received initial signal $R_T(m, n)$ by mixing the received HF signal with the signal of the frequency generator of the frequency $f'_p$, which is displaced in time by $T_{offs}$ relative to the generator signal of the initiator.

Accordingly, in the embodiment shown, a further first step S1 with m=3, n=0,1,2,3 and p=3 of a third step sequence is performed.

Subsequently, the second steps of the three step sequences are performed in reverse order.

In a second step S2 m=3, n=4,5,6,7 and p=3 of the third step sequence, a transmit signal $T_T(m, n)$ with the frequency $f_p$ is generated by the transponder FT from the determined baseband vector $V_T(m, n)$ using a mixer and the frequency generator and is coupled out as a response signal $T_T$ into the propagation medium PM.

The response signal $T_T$ m=3,n=4,5,6,7 is obtained from the received initial signal $R_T(m, n)$ m=3, n=0,1,2,3 using the function $F(R^T(m, n), \ldots)$ and thus formed at least from a portion of the received initial signal $R_T$.

During a reception period during the second step m=3, n=4,5,6,7 of the third step sequence, the initiator FI determines a received response signal $R_I(m, n), \ldots)$ with m=3, n=4,5,6,7, wherein the position of the received response signal $R_I$ with respect to the internal time reference of the initiator FI or the first timer $Z(t)$ is evaluated with the time $t=n*T_{MU}+m*T_{SF}$. To this end, the received HF signal of the frequency $f_p$ is converted to the baseband using a mixer and the signal of the frequency generator of the frequency $f_p$.

The corresponding discrete-time values for the initiator result from $t=n*T_{MU}+m*T_{SF}$ and for the transponder from $t'=n*T'_{MU}+m*T'_{SF}$.

The second steps S2 with m=2, n=4,5,6,7 and p=2 of the further step sequence as well as the second step S2 with m=1, n=4,5,6,7 and p=1 of the first step sequence are subsequently performed accordingly.

By transmitting information about the received initial signal $T_I$ using the response signal $T_T$, it is possible to directly determine a transfer function for the circulation (step sequence from step S1 and step S2) and/or a time offset on the basis of the received response signals $T_T$.

In order to ensure a coherence of all initial signals $T_I$ and response signals $T_T$ during a measurement cycle, the initiator FI and the transponder FT each include a coherent time and frequency control, wherein a rough time synchronization, for example by exchanging data frames via the data interfaces DS1 and DS2, takes place.

The temporal course of the method is outlined in particular in FIG. 3. Above the time axes t and $t'=t+T_{offs}$, the profile of the frequencies $\omega_p$ and $\omega'_p$, an action of the transmitting units TX of the transponder FT and of the initiator FI, an action of the receiving units RX of the transponder FT and of the initiator FI over three sequences of steps m=1 to m=3 are shown.

In addition, the activities of the transponder FT and the initiator FI are shown as vertically extending bars, with bold bars each indicating the switching from reception mode to transmission mode or from transmission mode to reception mode, thin bars with squares each indicating the transmission of a signal within a transmission time window and arrows indicating the reception of a signal.

Between each transmission action and the subsequent reception action or vice versa, there is always a step delay. Thereby, influences or disruptions due to the settling process of the radio nodes are prevented. The step delay is correspondingly greater than a settling time of the respective nodes. At the same time, it should be noted that the presented relations assume a settled steady state. This condition is met only for portions of the step delay, which are delimited by transition regions in which the corresponding settling states take place. In these, the corresponding signal vectors can only be used to a limited extent in the context of the method. In the present case, this relates to the vectors $R_{I,T}(m, n)$ with n=0,.4.

At least one valid receive vector per radio node per step of each step sequence is required for implementing the method in the sense described above.

The embodiment shown in FIG. 3 has transmission and reception periods, having a plurality of separate transmitting and receiving time windows. If one assumes a symmetrical distribution between the initiator FI and the transponder FT, the corresponding continuous-time transmission signals $T_I$ and $T_T$ with their values at the times $t=n*T_{MU}+m*T_{SF}$ and $t'=n*T'_{MU}+m*T'_{SF}$ oppose the corresponding number of reception time windows on the other side and thus allow for the determination of the associated receive vectors $R_T$ and $R_I$.

The time windows thus available can be used for different purposes. Here is a selection: Transmission of the reference phase of the transponder; Signaling between initiator and transponder (amplification and transmission power adjustments, . . . , encryption); Noise suppression by averaging a plurality of receive vectors, which were generated on the basis of a transmit vector of the opposite side; Assignment to different antennas to produce space diversity for determining angles of incidence in particular and for improving measurement accuracy in general (beam steering, MIMO, Smart Antenna); and/or For the detection of channel assignments in terms of LBT (Listen-before-Talk), CS (Carrier Sense) and DAA (Detect and Avoid) requirements for the approval of radio systems.

When dimensioning, both the respective settling processes and the maximum time offset fluctuations achievable by the rough synchronization should be considered, and the guard interval step delay or settling time should be designed accordingly.

FIGS. 3 shows the inventive method in accordance with a first embodiment of mode 2. The differences from the previous figures are explained below.

Figure 4:
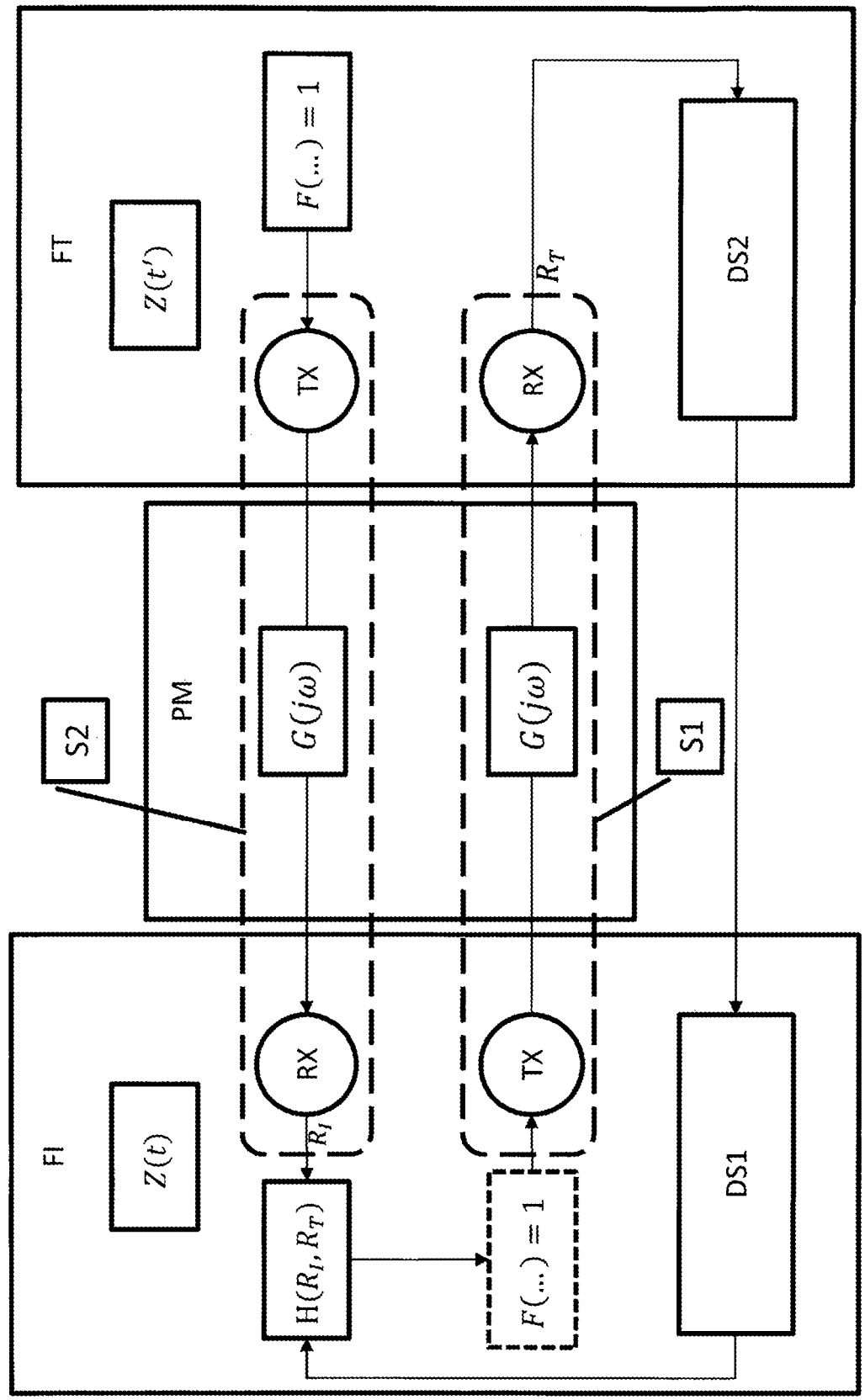
FIG. 4 is a schematic measurement arrangement for performing the inventive method for radio measuring applications in accordance with an exemplary.

FIG. 4 shows a schematic arrangement of the initiator FI and the transponder FT in mode 2.

Each first step S1 is initially performed in the same way as in mode 1. During the second step S2, the transponder FT is configured to generate the response signal $T_T$ by means of the transmitting unit TX, wherein the baseband vector $V_T$ to $V_T(m, n)=1$ is selected for the generation of the response signal $T_T$. This means that the transponder transmits a signal $T_T$ that only depends on its own time reference and is therefore independent from the initiator transmission signal $T_I$ or the receive signal vector $R_T$ determined therefrom.

The transponder FT is additionally adapted to at least partially transmit the received initial signal $R_T$ determined in the first steps S1 to the initiator by means of the data interface DS2.

The initiator FI is additionally adapted to receive the receive signals $R_T$ via the data interface DS1 and to determine the time offset $T_{offs}$ based on at least a portion of the received receive signals $R_T$ and the determined measurement vectors $R_I$.

Based on the time offset $T_{offs}$ and at least a portion of the receive signals $R_I$ received by the initiator FI, a transfer function for the radio channel between the transponder FT and the initiator FI can then be determined. It is thus possible to directly determine the transfer function for a single route between initiator and transponder and not for a two-way cycle.

The motivation of the one-way channel transfer function $G_{1_{WR}}(j\omega)=G(j\omega)$ as compared to the widespread determination of the two-way channel transfer function $G_{2_{WR}}(j\omega)=G^2(j\omega)$ will be explained.

The invention being thus described, it will be obvious that the same may be varied in many ways. Such variations are not to be regarded as a departure from the spirit and scope of the invention, and all such modifications as would be obvious to one skilled in the art are to be included within the scope of the following claims.

What is claimed is:

1. A method for radio measuring applications, the method comprising:
    operating a first radio node of at least two radio nodes as an initiator and operating a second radio node of the at least two radio nodes as a transponder, each of the first and second radio nodes has its own timer and a data interface, and there is a time offset between the timers of the first and second radio nodes;
    transmitting, in a first step, by the initiator an initial signal with a first carrier frequency, the initial signal being received by the transponder during a first reception period as a received initial signal;
    transmitting, in a second step, by the transponder a response signal with a second carrier frequency and the initiator receives the response signal during a second reception period as a received response signal, the first step and the second step forming a step sequence;
    performing, during a measurement cycle, one or more step sequences;
    performing first, the first steps of all step sequences and subsequently, the second steps of at least a portion of the step sequences in succession;
    assuming, for each repetition of the step sequence, by the first carrier frequency of the initial signal, a predetermined value within a predetermined frequency domain, the initial signals and the response signals of all step sequences being mutually coherent at least during the measurement cycle; and
    operating the method operates either in a first mode or in a second mode,
    wherein, in the first mode, the response signal is formed from at least a portion of the received initial signal and a transfer function and / or the time offset are determined on the basis of at least a portion of the received response signals,
    wherein, in the second mode, the response signal is formed independently from the received initial signal, at least one received initial signal is transmitted via the data interface and at least one transfer function and / or the time offsets are determined on the basis of at least portion of the received response signals and at least a portion of the received and transmitted initial signals, and
    wherein, within each step sequence, the second carrier frequency corresponds to the first carrier frequency or differs from the first carrier frequency.

2. The method according to claim 1, wherein the first steps of the step sequences during the measurement cycle are performed according to a first sequence and the second steps of the step sequences according to the first sequence or in a sequence which is reverse to the first sequence.

3. The method according to claim 1, wherein during a measurement cycle, the second steps of all step sequences are performed.

4. The method according to claim 1, wherein a first complex signal vector is determined from the received initial signal and the response signal is formed from the first complex signal vector or a reciprocal first complex signal vector or a conjugate complex first complex signal vector.

5. The method according to claim 1, wherein a first phase is determined from the received initial signal and the response signal is formed from the first phase or from an inverted first phase.

6. The method according to claim 1,
    wherein each of the first and second radio node operates over several step sequences at least once as an initiator and at least once as a transponder or each of the first and second radio node operates over several step sequences only as an initiator or only as a transponder.

7. The method according to claim 1, wherein, on the basis of the determined transfer function and / or the time offset, a distance between the one initiator and the one transponder is determined.

8. The method according to claim 1, wherein for at least one determined transfer function, a multipath analysis is carried out.

9. The method according to claim 1, wherein a filter is applied to the received response signals and / or the received initial signals.

10. The method according to claim 1, wherein, with each repetition of the step sequence, an amplitude and / or a phase of the initial signal is changed in addition to the carrier frequency of the initial signal.

11. The method according to claim 1,
    wherein the initiator transmits the initial signal during a first transmission period and the transponder transmits the response signal during a second transmission period, and
    wherein the first transmission period and the second transmission period each comprise a plurality of successive time windows, in each of the first and second transmission periods, transmissions are made only during the time windows and in each of the first and second transmission periods, two successive time windows follow one another immediately in time or are offset in time to each other.

12. A system, comprising:
    an initiator radio node and a transponder radio node, each of the initiator and transponder radio nodes having its own timer and a data interface, and there being a time offset between the timers of the initiator and transponder radio nodes,
    wherein the initiator and the transponder radio nodes are configured to perform one or more step sequences during a measurement cycle, each step sequence comprising first and second steps,
    wherein in the first step, the initiator radio node is configured to transmit an initial signal with a first carrier frequency, the initial signal being received by the transponder radio node during a first reception period as a received initial signal,
    wherein in the second step, the transponder radio node is configured to transmit a response signal with a second carrier frequency, the response signal being received by the initiator radio node as a received response signal, wherein the first steps of all of the one or more step sequences and the second steps of at least a portion of the one or more step sequences are performed in succession, wherein for each repetition of the step sequence, the first carrier frequency of the initial signal is a predetermined value within a predetermined frequency domain, the initial signals and the response signals of all step sequences being mutually coherent during the measurement cycle, wherein the initiator and the transponder radio nodes operate either in a first mode or in a second mode, wherein in the first mode, the response signal is formed from at least a portion of the received initial signal and a transfer function and / or the time offset are determined on the basis of at least a portion of the received response signals, wherein in the second mode, the response signal is formed independently from the received initial signal, at least one received initial signal is transmitted via the data interface and at least one transfer function and / or the time offsets are determined on the basis of at least portion of the received response signals and at least a portion of the received and transmitted initial signals, and wherein, within each step sequence, the second carrier frequency corresponds to the first carrier frequency or differs from the first carrier frequency.

* * * * *